United States Patent [19]
Lebby et al.

[11] Patent Number: 5,538,919
[45] Date of Patent: Jul. 23, 1996

[54] METHOD OF FABRICATING A SEMICONDUCTOR DEVICE WITH HIGH HEAT CONDUCTIVITY

[75] Inventors: Michael S. Lebby, Apache Junction; Chan-Long Shieh, Paradise Valley; Ken Davis, Tempe, all of Ariz.

[73] Assignee: Motorola, Schaumburg, Ill.

[21] Appl. No.: 443,609

[22] Filed: May 18, 1995

Related U.S. Application Data

[62] Division of Ser. No. 151,634, Nov. 15, 1993, Pat. No. 5,422,901.

[51] Int. Cl.$^6$ .................................................. H01L 21/20
[52] U.S. Cl. .......................... 437/129; 148/DIG. 95
[58] Field of Search ................. 437/129; 148/DIG. 95

[56] References Cited

U.S. PATENT DOCUMENTS

| | | | |
|---|---|---|---|
| H1,249 | 11/1993 | Machonkin et al. | 437/233 |
| 5,128,006 | 7/1992 | Mitchell et al. | 204/181.5 |
| 5,131,963 | 7/1992 | Ravi | 148/33.3 |
| 5,258,316 | 11/1993 | Ackley et al. | 437/129 |
| 5,293,392 | 3/1994 | Shieh et al. | 437/129 |
| 5,299,214 | 3/1994 | Nakamura et al. | 372/36 |
| 5,304,461 | 4/1994 | Inoue et al. | 430/323 |
| 5,317,587 | 5/1994 | Ackley et al. | 437/129 |
| 5,358,880 | 10/1994 | Lebby et al. | 437/129 |

OTHER PUBLICATIONS

K. D. Choquette et al., "Vertical-Cavity Surface-Emitting Lasers Fabricated by Vacuum Integrated Processing," IEEE Photonics Technology Letters, vol. 4, No. 9, (Sep. 1992), p. 951–954.

*Primary Examiner*—R. Bruce Breneman
*Assistant Examiner*—Linda J. Fleck
*Attorney, Agent, or Firm*—Eugene A. Parsons

[57] ABSTRACT

A VCSEL having a first mirror stack positioned on the surface of a substrate, an active region positioned on the first mirror stack and substantially coextensive therewith, and a second mirror stack positioned on the active region, the second mirror stack forming a ridge or mesa having a side surface. A metal contact layer is positioned on the side surface of the ridge or mesa and on portions of an end of the ridge or mesa to define a light emitting area, and a layer of diamond-like material is electrolytically plated on the metal contact layer so as to form a heat conductor to remove heat from the laser.

6 Claims, 3 Drawing Sheets

METHOD OF FABRICATING A SEMICONDUCTOR DEVICE WITH HIGH HEAT CONDUCTIVITY

This is a division of application Ser. No. 08/151,634, filed Nov. 15, 1993, now U.S. Pat. No. 5,442,901.

FIELD OF THE INVENTION

The present invention pertains to semiconductor devices and more specifically to the removal of heat from a semiconductor devices.

BACKGROUND OF THE INVENTION

In general, semiconductor devices such as vertical cavity surface emitting lasers (VCSEL) are constructed by providing a substrate with very smooth surface. A first stack of mirrors is then grown on the surface by semiconductor manufacturing techniques. An active area is grown on the upper surface of the first mirror stack and a second mirror stack is grown on the upper surface of the active area. Generally, metal contacts formed of an easily deposited metal, such as gold, titanium, tungsten, platinum, or the like, are provided. In general, one metal contact is provided in contact with the surface of the first (lower) mirror stack and a second metal contact on the upper surface of the second mirror stack.

One problem that occurs in VCSELs is to contain the lasing, or optical mode to a lowest order mode and to contain current flow to approximately the volume of the VCSEL in which lasing is occurring. Higher order lasing and extraneous flow of current outside the lasing area produces heat in the VCSEL and causes a substantial loss of power. Ridge, or top emitting mesa shaped, VCSELs are the preferred implementation over planar VCSELs because of the better current confinement and optical guiding.

In the fabrication of top emitting VCSELs, the alignment of the top electrical contact to the light emitting area is very important. Any misalignment of the electrical contact on the upper surface reduces the efficiency of the VCSEL. Further, the contact metal generally covers the sidewall of the mesa as a reflector to reduce the optical loss and increase efficiency. The problem is that the metal contacts are not sufficiently large in area and are generally too thin to effectively conduct heat generated within the VCSEL away from the VCSEL. In many instances large and heavy metal heat sinks are affixed to the VCSEL to absorb the heat. These are unsatisfactory for a number of reasons: they are large and bulky, they do not efficiently spread the heat, and the VCSEL is seldom constructed so that the heat sink can be positioned in close proximity to the source of the heat. For example, the heat sink is generally positioned on the rear surface of the substrate so that only heat traveling through the substrate, which is generally formed of poor heat conducting material such as gallium arsenide (GaAs), reaches the heat sink. A major portion of the heat remains in the VCSEL.

Accordingly, it is a purpose of the present invention to provide a new and improved VCSEL with heat conductivity.

It is a further purpose of the present invention to provide a new and improved VCSEL with heat conductivity which does not require a large and heavy heat sink.

It is a still further purpose of the present invention to provide a new and improved VCSEL with heat conductivity which is formed as additional steps of the fabrication process.

It is another purpose of the present invention to provide a new and improved VCSEL with heat conductivity in which heat conduction and spreading material is positioned adjacent heat generating portions of the VCSEL.

SUMMARY OF THE INVENTION

The above problems and others are at least partially solved and the above purposes and others are realized in a semiconductor device, such as a vertical cavity surface emitting laser with high heat conductivity including a first mirror stack positioned on the surface of a substrate, an active region positioned parallel and in overlying abutting engagement with the first mirror stack and substantially coextensive therewith, and a second mirror stack positioned parallel and in overlying abutting engagement with the active region, the second stack of mirrors forming a ridge or mesa having a side surface. A metal contact layer is positioned on the side surface of the ridge or mesa and on portions of an end of the ridge or mesa to define a light emitting area. A layer of diamond-like material is positioned to substantially cover the metal contact layer so as to form a heat conductor to remove heat from the laser. The metal contact layer and/or the diamond-like layer are positioned in contact with at least the first mirror stack and adjacent the active region to effectively conduct and spread heat generated in these areas. The diamond-like layer of material is deposited in a preferred embodiment by electrolytic plating so that it is formed as an additional step of the fabrication process.

BRIEF DESCRIPTION OF THE DRAWINGS

Referring to the drawings.

DESCRIPTION OF THE PREFERRED EMBODIMENTS

Figure 1:
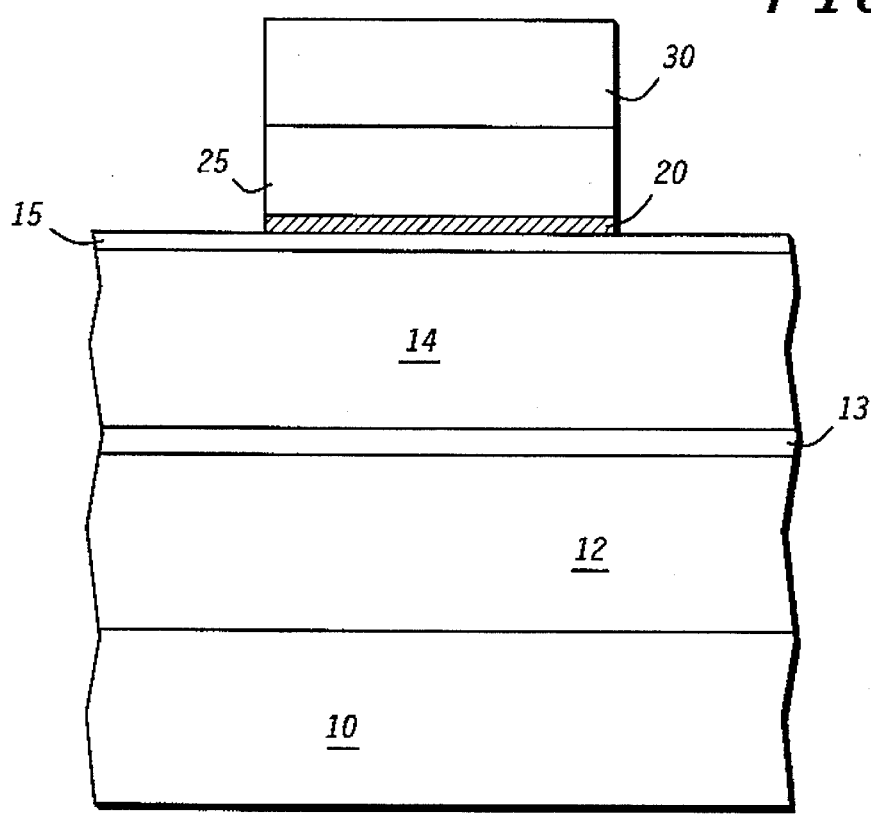
FIGS. 1–4 are simplified and greatly enlarged cross-sectional views illustrating several sequential steps in a method of fabricating VCSELs incorporating the present invention.

While the present method and apparatus for reducing heat in semiconductor devices may be utilized on a large variety of devices, the present disclosure utilizes vertical cavity surface emitting lasers as a prime example because of the heat problem envolved in these devices. To better understand the present method of fabricating VCSELs, several sequential steps in one specific method are illustrated in FIGS. 1–4. It should be understood that the specific method described and illustrated is simply for purposes of explanation and virtually any of the well known methods of fabrication can be utilized. Referring specifically to FIG. 1, a substrate 10 of any convenient material is provided. Generally, substrate 10 is gallium arsenide (GaAs) or the like which, as will be understood presently, is compatible with layers subsequently grown thereon. A first mirror stack 12 of Bragg mirrors, which in this specific embodiment is n-type conductivity, is grown on an upper surface of substrate 10. An active area 13, generally containing a plurality of quantum wells and cladding regions on either side of the quantum wells, is grown on first mirror stack 12 and a second mirror stack 14 of Bragg mirrors, which in this specific embodiment is p-type conductivity, is grown on active area 13. Generally, first mirror stack 12, active area 13 and second mirror stack 14 are grown on substrate 10 epitaxially. The formation of first mirror stack 12, active area 13 and second mirror stack 14 is well known in the art and will not be elaborated upon further in this disclosure.

Generally, a thin heavily doped (p-type dopant) contact layer 15 of material, similar to one of the materials forming second mirror stack 14, is provided at the upper surface of second mirror stack 14. A first metal contact layer 20 is deposited on the upper surface of layer 15 and forms an ohmic contact therewith. In this specific embodiment metal contact layer 20 is formed of titanium tungsten (TiW) because it is convenient to deposit and is a p-type contact metal compatible with contact layer 15. A layer 25 of etchable material is deposited on metal contact layer 20 and a layer 30 of masking material is deposited on etchable layer 25. In this specific embodiment, layer 25 is formed of polyimide, which is easy to etch to a specific and desired depth. Layer 30 is formed of silicon oxynitride (SiON) or gold, either of which are relatively resistant to some etches used later in the process, as will be seen presently.

Layers 20, 25 and 30 are used as an etch mask later in the process and, as illustrated in FIG. 1, are formed to define a ridge, or mesa (designated 16 in FIG. 2), of a VCSEL. Layers 20, 25 and 30 may be formed into an etch mask in one of at least two different ways or a combination of both ways. In a first series of steps, layers 20, 25 and 30 are deposited to cover contact layer 15. Using conventional lithography and reactive ion etch, layers 20, 25 and 30 are patterned into the illustrated etch mask with a vertical profile. In a second series of steps, layers 20, 25 and 30 are selectively deposited using, for example, conventional photoresist lift-off techniques.

Figure 2:
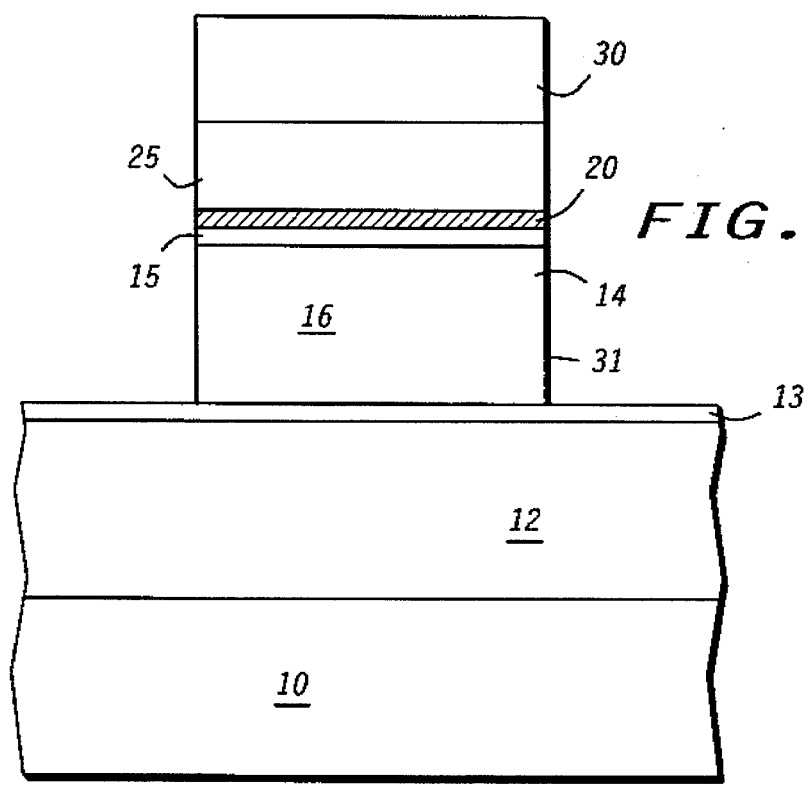

Once the etch mask is in place, contact layer 15 and second mirror stack 14 are etched to a predetermined depth so as to define a generally circular ridge or mesa 16, as illustrated in FIG. 2. In this etch step, any well known semiconductor etching process can be utilized, including chlorine reactive ion etch, chemically assisted ion beam etching, or the like. The profile of the etch is vertical and exposes sidewalls 31 of ridge or mesa 16 (second mirror stack 14). It is important to stop this etch step before it touches active area 13 so that reliability is not compromised, see for example U.S. Pat. No. 5,034,092, entitled "Plasma Etching of Semiconductor Subtrates" issued Jul. 23, 1991. In the embodiment illustrated in FIG. 2, the etch step is stopped short of the bottom of second mirror stack 14 to insure that it does not touch active area 13.

Figure 3:
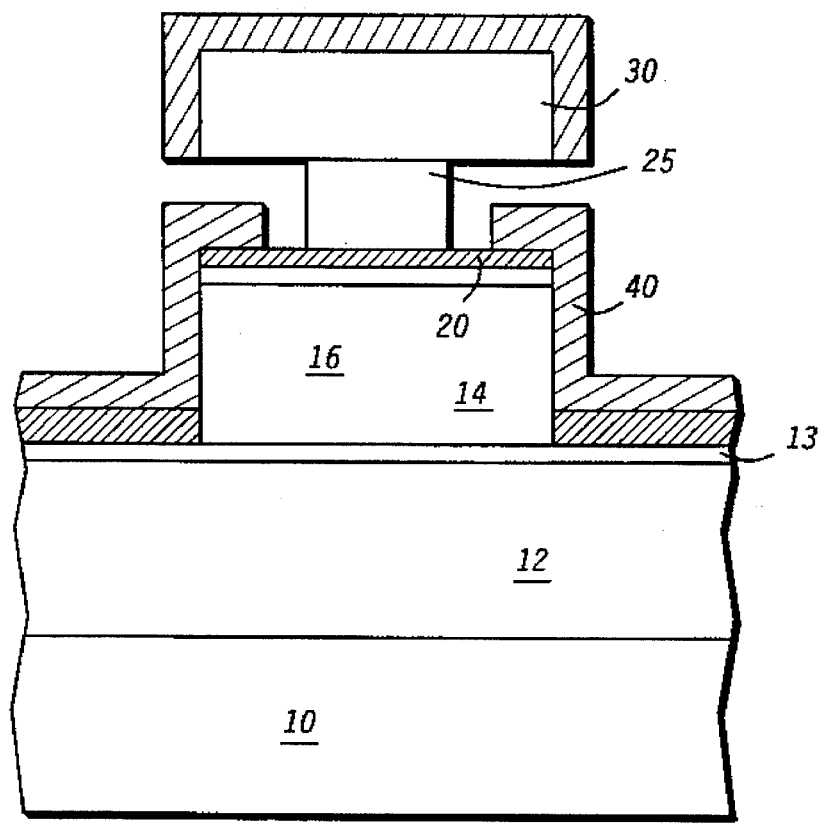

With ridge or mesa 16 formed, a portion of etchable layer 25 is removed to expose a first portion of metal contact layer 20, as illustrated in FIG. 3. A portion of etchable layer 25 is undercut, in this specific embodiment, in an oxygen plasma. The undercut removes approximately 1.5 to 2 μm immediately adjacent sidewalls 31. A relatively thick metal contact layer 40 is deposited over the entire structure, and especially on the exposed portions of metal contact layer 20 and sidewalls 31. The remaining portions of etchable layer 25 and layer 30 of masking material define the light emission window for the VCSEL and limit the deposition of metal contact layer 40 to outside the light emission window. In this specific embodiment, metal contact layer 40 is formed of a second layer of aluminum/titanium tungsten sputter deposited onto the first layer of titanium tungsten forming metal contact layer 20 and at least sidewalls 31. An alternate second layer which can be utilized is, for example, a sputtered or angled E-beam gold layer. Some of the metal contact layer 40 may also extend laterally outward away from sidewalls 31 of ridge or mesa 16 to provide an area for receiving an external contact (not shown).

It will be understood by those skilled in the art that sputter deposition of metal into the undercut area between layers 20 and 30 generally follows a straight line path so that most of the undercut area is shadowed by layer 30 and no deposition will occur thereon. However, some limited deposition into the undercut area will occur and the amount of deposition (distance into the undercut area) is determined by the thickness of layer 25, or the distance between layers 20 and 30. Thus, when sputter deposition of contact metal layer 40 is performed the thickness of layer 25 accurately determines the definition of the light emission window or the amount of layer 20 which is covered by layer 40. If other metal deposition methods are used, such as angled E-beam, layer 25 can act as a mask on layer 20 and define the light emission window by directly limiting (masking) the amount of metal deposited in the undercut area.

Figure 4:
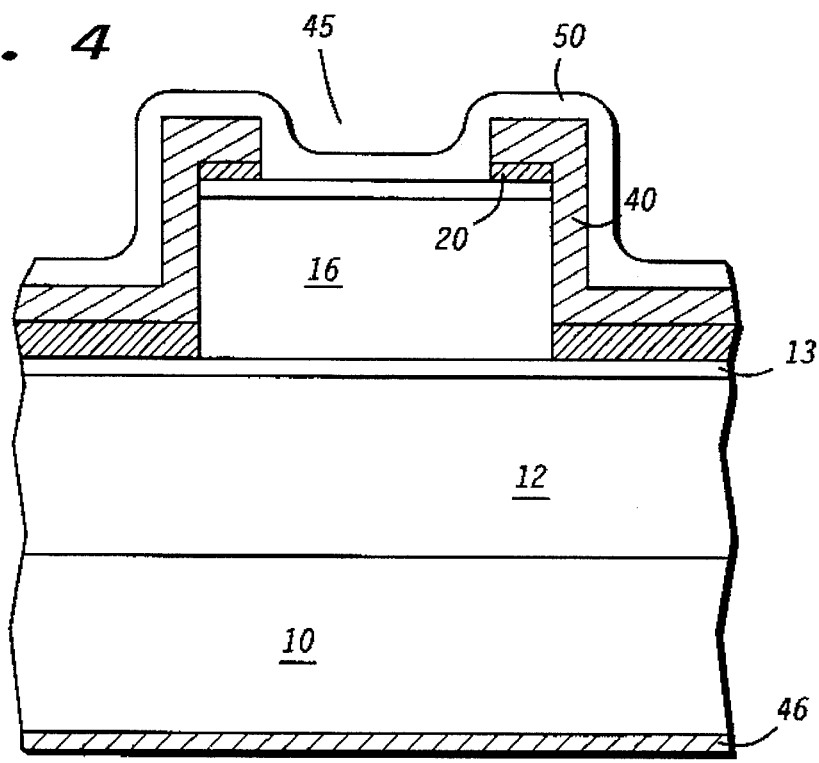

With metal contact layer 40 in place, layers 25 and 30, along with any portion of metal contact layer 40 deposited thereon, are removed, as illustrated in FIG. 4. The deep undercut in etchable layer 25 makes the use of a conventional lift off step possible in this removal. With the etch mask removed, the exposed portion of relatively thin metal contact layer 20 is removed to expose or open a light emission window 45 of the VCSEL. Exposed portions of metal contact layer 20 can be removed by etching, as for example by reactive ion etching. An n-metal contact 46 and a p-metal contact (not shown) are formed. In the specific embodiment illustrated in FIG. 4, n-metal contact 46 is deposited on the rear, or bottom, surface of substrate 10 but it will be understood that several configurations are available for placing both of the electrical contacts on the same side of the VCSEL.

A layer 50 of diamond or diamond-like material (generally carbon atoms bonded into the well known diamond bond) is deposited on the surface of contact metal layer 40 as well as the exposed upper end (light emission window 45) of mirror stack 14. In this preferred embodiment layer 50 is deposited by utilizing electrolysis to plate the diamond or diamond-like material onto the metal and/or GaAs surfaces. Generally, plating diamond by electrolysis is known in the art, as disclosed in articles by Yoshikatsu Namba, entitled "Attempt to grow diamond phase carbon films from an organic solution", in *J. Vac. Sci Technol.A* 10(5), Sep/Oct 1992, pp. 3368–3370 and *Diamond Depositions: Science and Technology*, Vol. 3, No. 7, PP 1–2, published by Superconductivity Publications, Inc., Somerset, N.J. While layer 50 of diamond-like material can be deposited by a number of different methods, including plasma chemical vapor deposition, hot filament chemical vapor deposition, laser ablation techniques, etc., electrolytic plating is preferred because of its simplicity and compatibility with the other fabrication steps and because of the low plating temperatures, which does not interact with prior semiconductor processes.

It will of course be understood that depositing layer 50 on the surface of light emission window 45 is optional and to some extent dependent upon the light transmission qualities of the diamond-like material being deposited. Generally, electrolytically plated diamond is transparent to light wavelengths in the range of approximately 500 nm to 1600 nm and the preferred wavelength of transmission for VCSELs is approximately 850 nm. It should further be understood that layer 50 is very heat conductive but a good insulator for electricity so that layer 50 can be deposited over the entire VCSEL as well as any adjoining VCSELs or circuits to form a broad heat conductor with a relatively large heat spreading area. Also, layer 50 is in direct contact with contact metal layer 40 and any portions of mirror stack 14 or active region 13 which are not covered by contact metal layer 40, so that layer 50 is positioned in contact with or immediately adjacent heat generating portions of the VCSEL.

Figure 5:
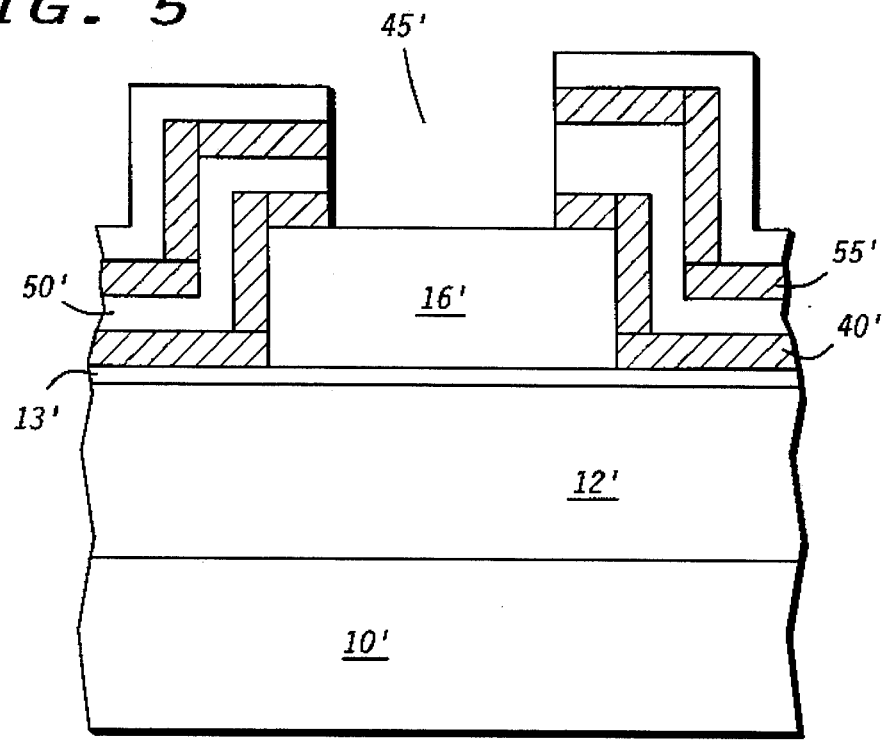
FIG. 5 is partial sectional view, similar to FIG. 4, of another embodiment of a VCSEL incorporating the present invention.

Referring to FIG. 5, another embodiment of a VCSEL, similar to that illustrated in FIG. 4 is shown. In the VCSEL of FIG. 5, components similar to those explained in conjunction with FIG. 4 are designated with a similar number having a prime added to indicate the different embodiment. Because layers of electrolytically plated diamond can be relatively thin, it may be advantageous in some applications to plate a plurality of alternate layers of metal and diamond, generally designated 55', on contact metal layer 40'. This plurality of layers provides sufficient thickness to quickly and efficiently conduct heat from the VCSEL and spread it for dissipation. It should be understood, that a layer of diamond could be deposited as a first insulation layer with contact metal layer 40' deposited thereover, if desired.

Figure 6:
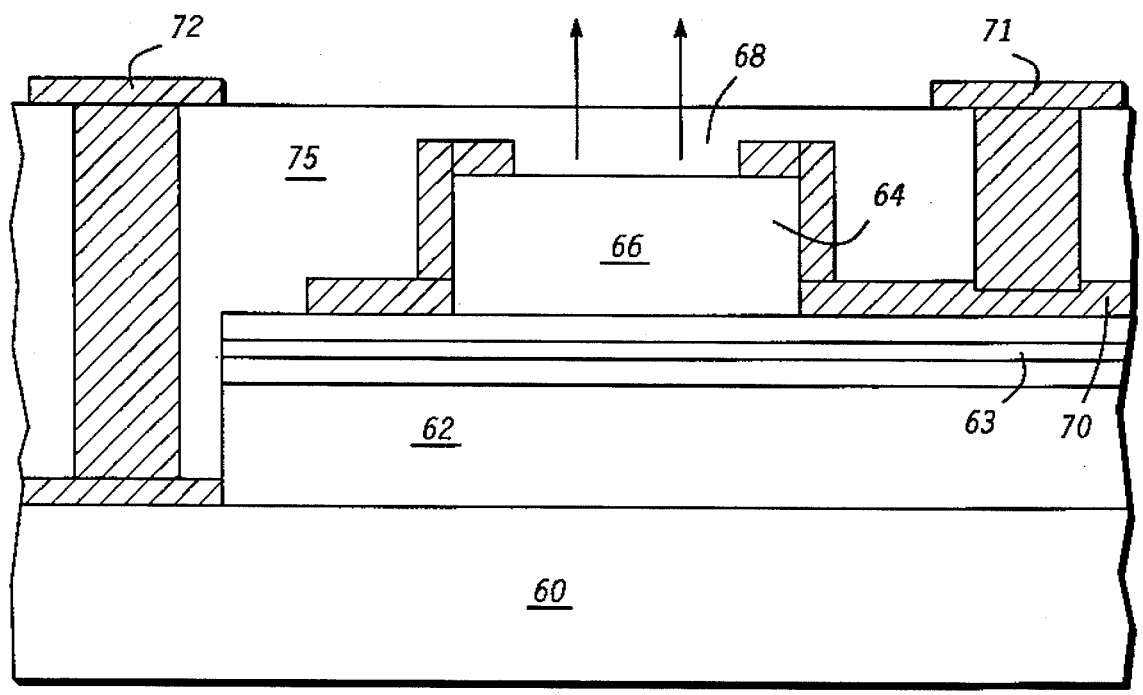
FIG. 6 is a partial sectional view of yet another embodiment of a VCSEL incorporating the present invention.

Referring to FIG. 6, another embodiment of a vertical cavity surface emitting laser with high heat conductivity is illustrated. In this embodiment a substrate 60 of any convenient material is provided. Generally, substrate 60 is gallium arsenide (GaAs) or the like which is compatible with layers subsequently grown thereon. A first mirror stack 62 of Bragg mirrors is grown on an upper surface of substrate 60. An active area 63, generally containing a plurality of quantum wells and cladding regions on either side of the quantum wells, is grown on first mirror stack 62 and a second mirror stack 64 of Bragg mirrors is grown on active area 63. Generally, first mirror stack 62, active area 63 and second mirror stack 64 are grown on substrate 60 epitaxially. Second mirror stack 64 is etched to a predetermined depth so as to define a generally circular ridge or mesa 66.

A layer 70 of contact metal is deposited over the end and side surfaces of ridge or mesa 66 and patterned to define a light emission window 68. A layer 75 of diamond or diamond-like material is deposited over the entire structure thick enough to planarize the structure. Contacts 71 and 72 are formed through diamond layer 75, by any convenient method, so as to contact layer 70 and first mirror stack 62, respectively, in a normal electrical connection. This structure has several advantages, including a thick layer of diamond-like material to conduct and spread the heat produced by the VCSEL and planarized electrical contacts, which greatly simplifies external electrical connections to the VCSEL.

Thus, a new and improved semiconductor device with improved heat conductivity has been disclosed which is easy to fabricate and use. The diamond layers can be deposited by elecrolysis which only requires relatively low temperatures and, therefore, does not interfere or interact with prior semiconductor and other fabrication processes. Generally, the diamond provides an improved heat conductivity by way of a distributed layer of diamond that can be formed in additional steps of the fabrication process. Further, the new and improved semiconductor device does not require a large and heavy heat sink because the diamond-like layers effectively and efficiently conduct and spread the heat. Also, in the new and improved VCSEL the diamond heat conduction and spreading material is positioned in direct contact with or immediately adjacent to heat generating portions of the VCSEL, which greatly improves the effectiveness and efficiency. It will be understood that while a specific VCSEL is utilized herein for purposes of explanation, that many other types of semiconductor devices and VCSELs can benefit from this method.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a vertical cavity surface emitting laser with high heat conductivity comprising the steps of:

providing a substrate;

forming a first mirror stack on the substrate, an active area on the first mirror stack and a second mirror stack on the active area, the second mirror stack being formed into a ridge or mesa having a side surface and an upper surface;

depositing a metal contact layer on portions of the side surface and the upper surface of the second mirror stack so as to form an ohmic contact with the second mirror stack; and depositing a layer of diamond-like material having the characteristic of high heat conductivity on the upper and side surfaces of the mesa, including the metal layer, so as to form a heat conductor to remove heat from the laser.

2. A method of fabricating a vertical cavity surface emitting laser with high heat conductivity as claimed in claim 1 wherein the step of depositing a layer of diamond-like material includes plating the diamond-like material by electrolysis.

3. A method of fabricating a vertical cavity surface emitting laser with high heat conductivity as claimed in claim 2 wherein the step of plating the diamond-like material by electrolysis includes a plurality of alternate steps of electrolytically plating diamond-like material and metal.

4. A method of fabricating a vertical cavity surface emitting laser with high heat conductivity as claimed in claim 1 wherein the step of depositing a layer of diamond-like material includes planarizing the layer of diamond-like material over the end and side surfaces of the ridge or mesa of the laser.

5. A method of fabricating a vertical cavity surface emitting laser with high heat conductivity as claimed in claim 4 including in addition the step of forming electrical contacts at a planarized surface of the layer of diamond-like material.

6. A method of fabricating a vertical cavity surface emitting laser with high heat conductivity comprising the steps of:

providing a substrate;

forming a first mirror stack on the substrate, an active area on the first mirror stack and a second mirror stack on the active area, the second mirror stack having an upper surface;

depositing a first metal contact layer on the upper surface of the second mirror stack so as to form an ohmic contact with the second mirror stack;

depositing a layer of etchable material on the first metal contact layer and a layer of masking material on the layer of etchable material;

selectively removing portions of the layer of masking material, the layer of etchable material and the first metal contact layer to form an etch mask defining the ridge VCSEL;

etching the second mirror stack, using the etch mask, to form a ridge or mesa having a side surface;

removing portions of the layer of etchable material to expose a first portion of the first metal contact layer;

depositing a second metal contact layer on the side surface of the ridge or mesa and the exposed first portion of the first metal contact layer to define a light emitting area;

removing the layers of etchable and masking materials to expose a second portion of the first metal contact layer in the light emitting area;

removing the exposed second portion of the first metal contact layer to expose the light emitting area; and depositing a layer of diamond-like material having the characteristic of high heat conductivity on the second metal layer.

* * * * *